(12) United States Patent
Wojnarowski et al.

(10) Patent No.: US 7,482,634 B2
(45) Date of Patent: *Jan. 27, 2009

(54) MONOLITHIC ARRAY FOR SOLID STATE ULTRAVIOLET LIGHT EMITTERS

(75) Inventors: Robert John Wojnarowski, Ballston Lake, NY (US); Stanton Earl Weaver, Jr., Northville, NY (US); Abasifreke Udo Ebong, Marietta, GA (US); Xian An (Andrew) Cao, Kingston, NY (US); Steven Francis LeBoeuf, Schenectady, NY (US); Larry Burton Rowland, Scotia, NY (US); Stephen D. Arthur, Glenville, NY (US)

(73) Assignee: Lockheed Martin Corporation, Bethesda, MD (US)

(*) Notice: Subject to any disclaimer, the term of this patent is extended or adjusted under 35 U.S.C. 154(b) by 439 days.

This patent is subject to a terminal disclaimer.

(21) Appl. No.: 10/950,029

(22) Filed: Sep. 24, 2004

(65) Prior Publication Data

US 2006/0071219 A1 Apr. 6, 2006

(51) Int. Cl.
*H01L 33/00* (2006.01)
(52) U.S. Cl. ............................ 257/95; 257/88; 257/94; 257/98; 257/E33.005
(58) Field of Classification Search .................. 257/79, 257/88, 94, 95, 98
See application file for complete search history.

(56) References Cited

U.S. PATENT DOCUMENTS 6,072,197 A * 6/2000 Horino et al. ............... 257/103
6,188,527 B1    2/2001  Bohn
6,337,493 B1    1/2002  Tanizawa et al.
6,407,411 B1    6/2002  Wojnarowski et al.
6,452,217 B1    9/2002  Wojnarowski et al.
6,547,249 B2 *  4/2003  Collins, III et al. ............ 257/88
6,635,987 B1   10/2003  Wojnarowski et al.
6,664,560 B2   12/2003  Emerson et al.
6,995,406 B2 *  2/2006  Tojo et al. .................... 257/103
2003/0201453 A2* 10/2003  Edmond ....................... 257/99
2005/0264172 A1* 12/2005  Wojnarowski et al. ...... 313/498

OTHER PUBLICATIONS

Document entitled "Identification of Copending Cases".

* cited by examiner

*Primary Examiner*—Wai-Sing Louie
(74) *Attorney, Agent, or Firm*—Scully, Scott, Murphy & Presser, P.C.

(57) ABSTRACT

The present invention is directed towards a source of ultraviolet energy, wherein the source is a UV-emitting LED's. In an embodiment of the invention, the UV-LED's are characterized by a base layer material including a substrate, a p-doped semiconductor material, a multiple quantum well, a n-doped semiconductor material, upon which base material a p-type metal resides and wherein the base structure has a mesa configuration, which mesa configuration may be rounded on a boundary surface, or which may be non-rounded, such as a mesa having an upper boundary surface that is flat. In other words, the p-type metal resides upon a mesa formed out of the base structure materials. In a more specific embodiment, the UV-LED structure includes n-type metallization layer, passivation layers, and bond pads positioned at appropriate locations of the device. In a more specific embodiment, the p-type metal layer is encapsulated in the encapsulating layer.

10 Claims, 15 Drawing Sheets

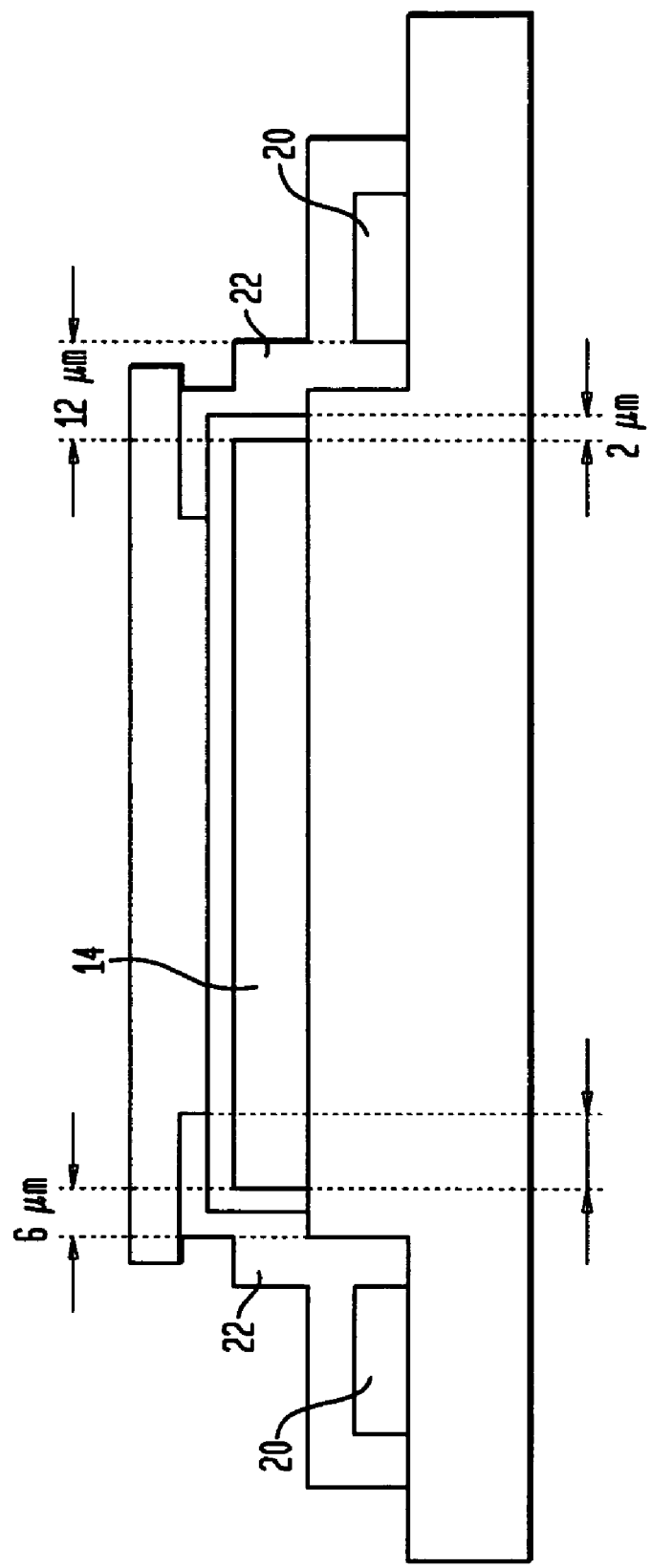

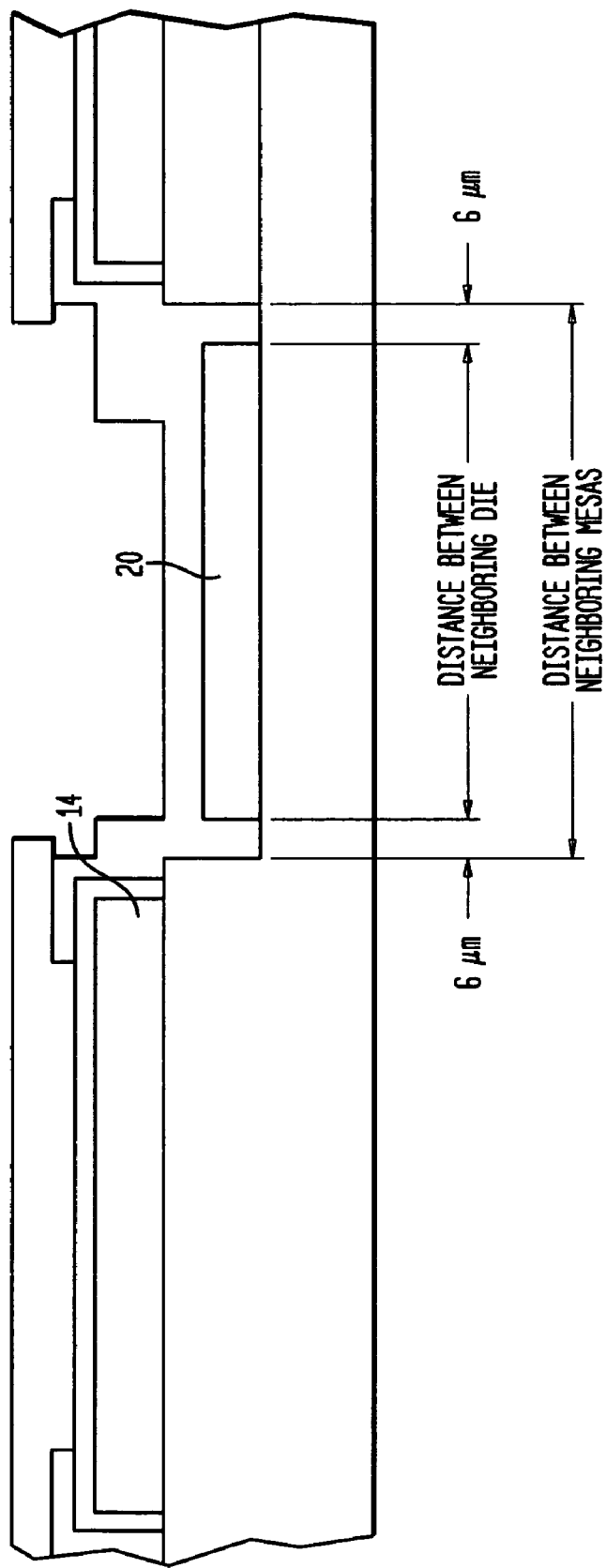

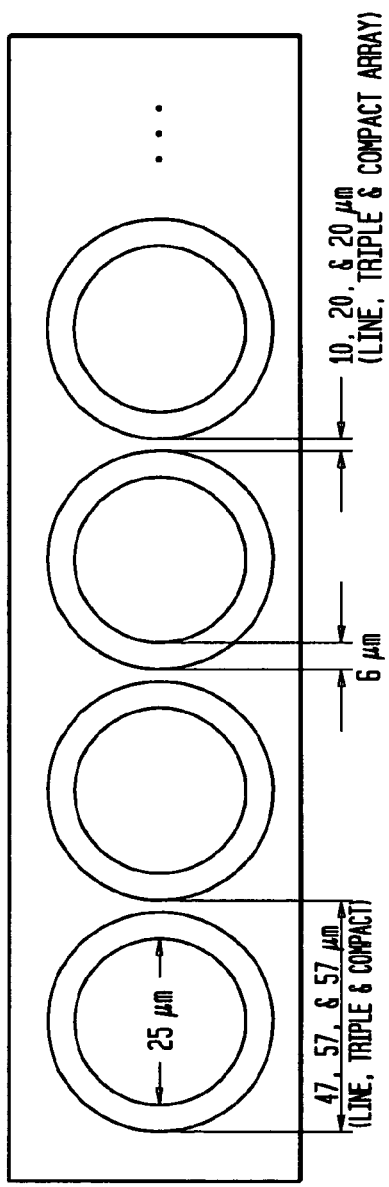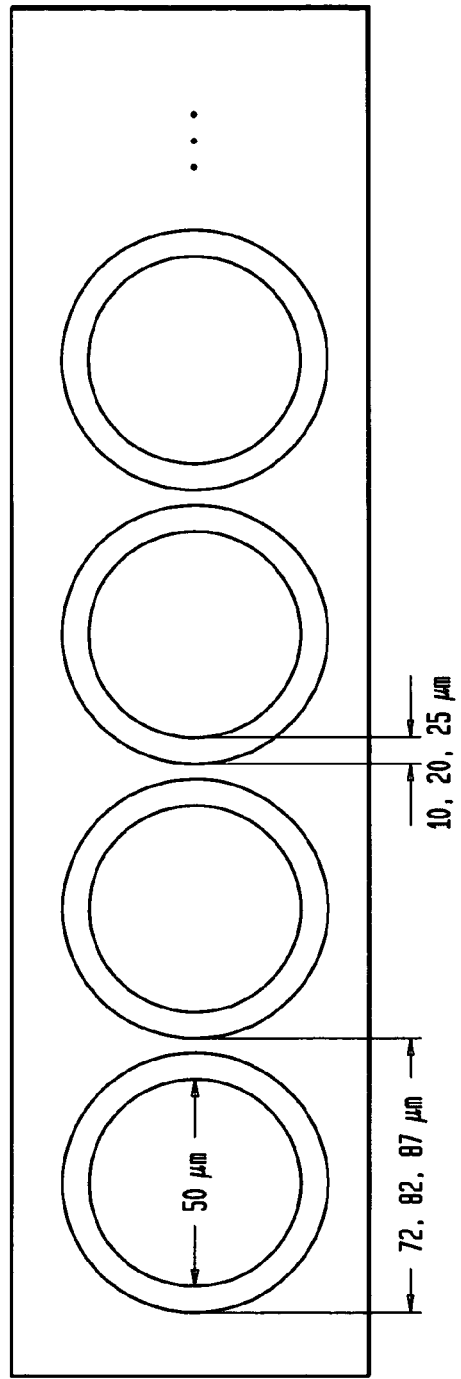

MONOLITHIC ARRAY FOR SOLID STATE ULTRAVIOLET LIGHT EMITTERS

FIELD OF INVENTION

The present invention is directed to an LED, and arrays of same. In particular, the LED emits energy in the ultra-violet (optical wavelength greater than or equal to 150 nm and less than or equal to 410 nm) portion of the electromagnetic spectrum.

BACKGROUND OF THE INVENTION

Consideration has been given to using single color LED's, such as red, blue or green LED's, in combination with fluorescent and phosphorescent materials to produce another desired color. While certain materials respond fluorescently or phosphorescently to light from the visible portion of the spectrum, and thus would respond to visible LED's, there are a number of materials which respond to the relatively higher-energy photons emitted in the ultraviolet portion of the spectrum. Furthermore, UV-emitting LED's may, in combination with the appropriate phosphor, prove to be a source of white light providing a high level of satisfaction. That is, white light generated from a UV LED and accompanying phosphor may lack the artifacts of a colored light source employed to produce light from an LED emitting in the colored portion of the visible spectrum. For example, this phenomenon is believed to affect blue LED's when used to excite a phosphor during production of white light, where the generated white light is believed to exhibit a blue component. Accordingly, recent interest has focused upon the use of a UV-emitting LED.

At least certain prior art LED devices emit light in directions that may be undesirable, such as through the sides of the diode, as opposed to only substantially through the preferred side for the emission of energy. Depending upon the end use for which the LED is employed, this may not be a problem. However, as indicated, there may be instances where emissions in undesired directions have substantial unwanted consequence. For example, in UV-induced fluorescence detection applications, stray UV light can dramatically increase the background noise in the photodetection of fluorescent light. Further, in such application, it is preferred that a focused beam of UV light is provided to generate sufficient fluorescence for localized photodetection. At the very least, emissions in undesired directions may be indicative of an inefficient device.

SUMMARY OF THE INVENTION

The present invention is directed towards a source of ultraviolet energy, wherein the source is a UV-emitting LED's. In an embodiment of the invention, the UV-LED's are characterized by a base layer material including a substrate, a n-doped semiconductor material, a multiple quantum well, a p-doped semiconductor material, and corresponding n- and p-metallization in contact with the n- and p-layers respectively. The base layer material has a mesa configuration that may be rounded on a boundary surface, or which may be non-rounded, such as a mesa having an upper boundary surface that is flat. In other words, the p-type metal resides upon a mesa formed out of the base structure materials. In a more specific embodiment, the UV-LED structure includes passivation layers and bond pads positioned at appropriate locations of the device. In a more specific embodiment, the p-type metal layer is encapsulated in the encapsulating layer.

In yet another embodiment, LED's substantially as described above, are arranged spatially and/or arrayed in particular arrangements that vary, for example, the number of rows of diodes, the number of diodes per row, diode spacing, the amount of n-metal present between each mesa, and diode offsets—that is, the offset between diodes of a given row and the diodes of an adjacent row, as indicated later in this paper. In yet another embodiment, circular diodes of specified diameters are employed. In one specific embodiment, the diode diameters are about 100 μm or even less. Such arrangements and combinations thereof, have been found to improve the output of UV energy, for example, by improving current spreading through the LED's. Furthermore, the arrangement and combinations provide the artisan with the ability to adjust the output from the device and/or minimize, if not eliminate, undesired effects that result where unwanted material defects enter the field of emission, which would otherwise interfere with the emission of light.

It is believed that the structures described herein are capable of transmitting a collimated band of energy, which is desirable for devices in which narrow transmission bands are desired. For example, a device of the present invention, emitting collimated energy, may be employed in a device detecting the presence or absence of a given thing, and/or for the measurement of same, where for instance, the presence, absence, or measurement of that phenomena is in some way related to the measurement of the emission after it encounters (or does not encounter) the thing to be detected or measured. In these instances, generalized emissions (such as through the side of the device), could render the measurement less accurate or reliable.

Also, it is believed that output from the diodes of the present invention are substantially limited to the UV-portion of the electromagnetic spectrum. In other words, the output is substantially devoid of emissions in the visible portion of the spectrum, such as visible light in the yellow portion of the spectrum. This may be due to improved current spreading which allows higher current densities and "swamping out" of defect emission by near-band-edge emission. However, having smaller mesas, less than 100 um in diameter, also reduces the optical volume of n- and p-cladding layers, which may be plagued with sub-band-edge luminescent structural and point defects, allowing light to escape the mesa in a shorter optical path length.

In another aspect of the present invention, LEDs of the present invention are arrayed in linear, triple, and compact arrays, as described herein. In a more specific embodiment of the invention, the LEDs are circular in shape, having diameters not exceeding 100 μm, and are spaced by a predetermined amount of n-metallization layer, as measured linearly, between adjacent diodes.

In another aspect of the invention, the LED's of the present invention have mesas that are provided with a rounded boundary surface contour resembling, for example, a hemisphere or parabola, an ellipse, or combinations thereof.

In one aspect, the term "collimated" light or energy refers to a parallel or substantially parallel band of energy emitted from its diode source, with lateral energy spreading, away from the cross-sectional area of the diode, limited to approximately +/−15° as measured radially from a line extending from the edge of the emission source, in the direction of the emitted energy.

BRIEF DESCRIPTION OF THE FIGURES

FIG. 9 is a cross sectional view of a circular LED of the present invention;

FIG. 10 is a cross sectional view of adjacent LED's (and the region between them);

FIG. 11 is a top plan view of 25 μm circular diodes;

FIG. 12 is a top plan view of 50 μm circular diodes;

FIG. 22a is a cross sectional view of the embodiment shown in FIG. 22.

DETAILED DESCRIPTION OF THE INVENTION

Figure 1:
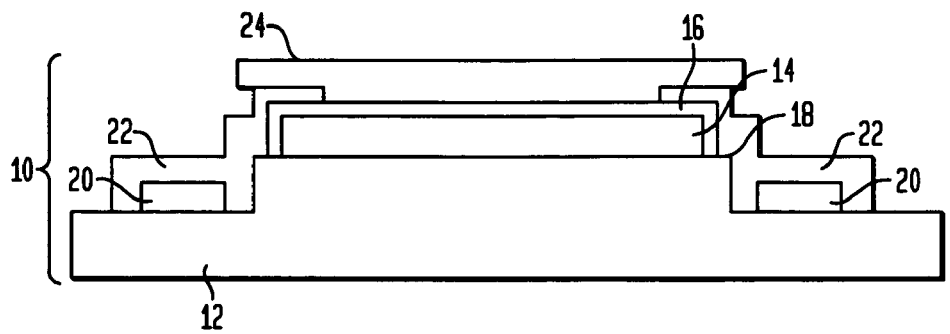
FIG. 1 is a LED of the present invention, depicted in cross-section.
Figure 1A:
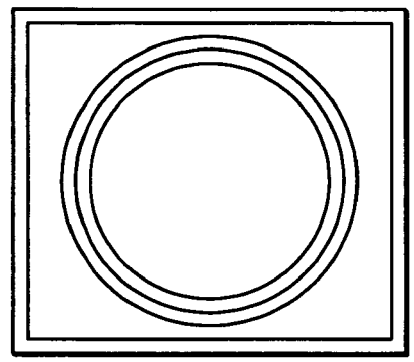
FIG. 1a is a top plan view of the LED of the present invention.

An LED 10 of the present invention is depicted in FIG. 1. It should be understood that the LED will be incorporated into arrays including a plurality of LED's, which is discussed and shown later in this disclosure.

LED 10 includes the following components: base layer 12, p-metal layer 14, encapsulant 16, mesa 18, n-metallization layer 20, passivation layer 22, p-bond pad 24 and n-bond pad 26 (not shown in FIG. 1). The bond pads are used to connect the device to a suitable package.

Figure 8:
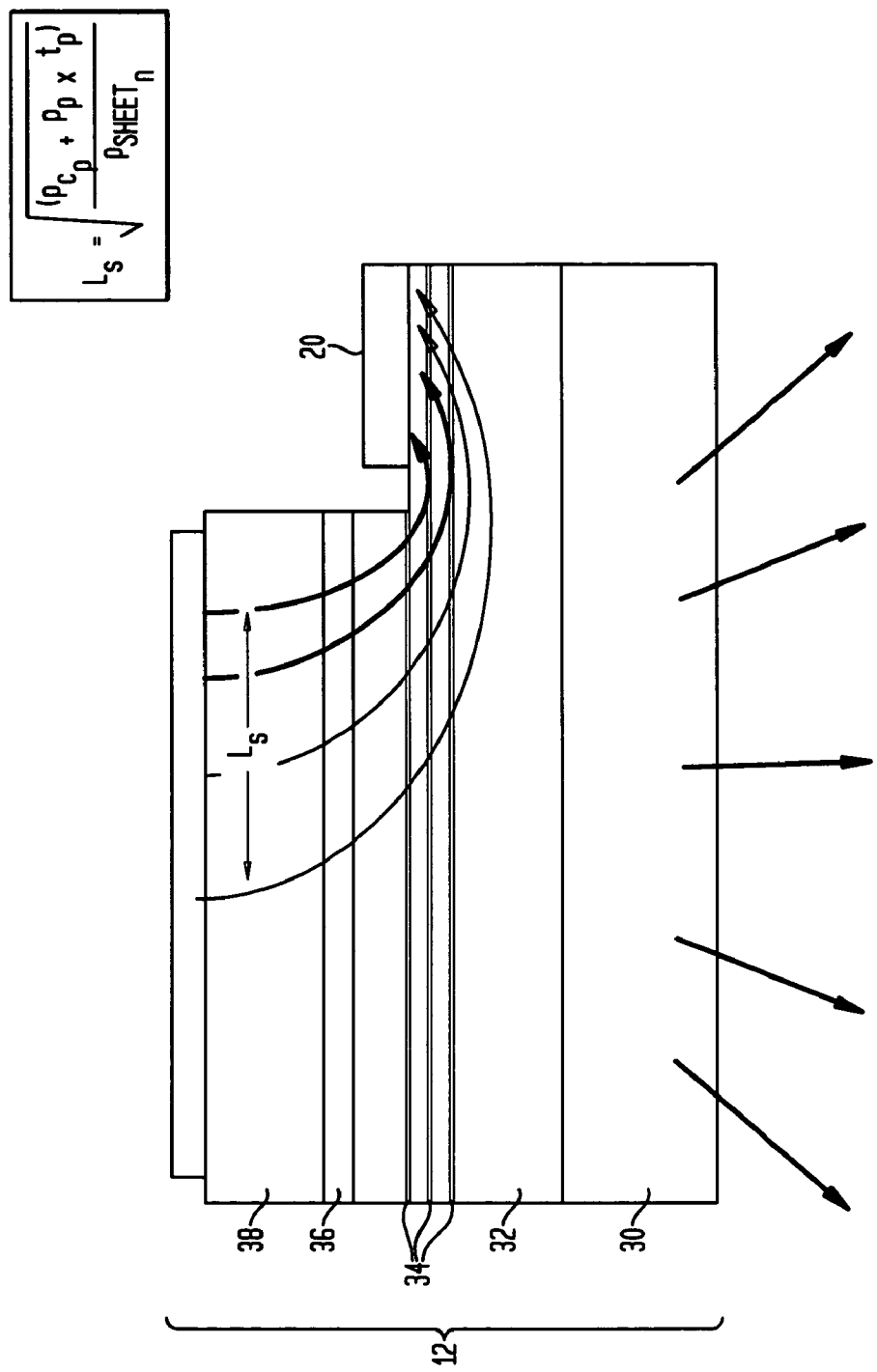
FIG. 8 is a cross-sectional view of a substrate employed in the LED of the present invention.

Base layer 12 is a multiple component element. As depicted in FIG. 8, base layer 12 includes a substrate 30, such as a substrate of sapphire, silicon carbide, zinc oxide, gallium nitride, and any combination of a gallium nitride-aluminum-indium alloy of the formula $Al_xIn_yGa_{1-x-y}N$, wherein x+y<1, and GaAF. An epitaxial layer of an n-doped containing material 32 is deposited upon the substrate 30. Here the n-doped material may be any conventional material, such as GaN doped with silicon. As shown in FIG. 8, a silicon dopant is present in one or more delta doped layers, that is, one or more discreet layers 34 of dopant. A delta-doped arrangement may be advantageous in terms of promoting structural integrity of the device and/or facilitating spreading of current through the base structure. However, other doping schemes may be employed instead of delta doping. An active region of multiple quantum wells (MQW's) 36 is positioned upon the n-cladding layer. MQW's may be constructed of material known to be suited for this purpose, such as alternating layers of undoped aluminum indium gallium nitride alloys, doped or undoped, of any stoichiometry, having different ratios of aluminum, indium, and gallium for quantum confinement. A layer of p-doped material 38, such as GaN, AlGaN, or AlInGaN (any stoichiometry) doped with Mg, is deposited upon the MQW layer.

Group III-nitride epitaxial films are typically deposited using MOCVD (metal organic chemical vapor deposition), MBE (molecular beam epitaxy), HVPE (hydride vapor phase epitaxy) or other epitaxial deposition technique. The substrate can be any variety of materials: sapphire, silicon, SiC, GaN, AlN, InN, AlIn, AlInGaN with any alloy combination, lithium gallate, etc.

Before epitaxy, the precleaned wafers are annealed at high temperature in hydrogen and subsequently in ammonia. An optional template layer for nucleation, followed by a III-nitride template layer, are then deposited. A cladding layer is then deposited (typically n-cladding) followed by an active region (typically a multiple quantum well) a blocking layer (typically undoped) and another cladding layer (typically p-doped). The cladding layers are either uniformly doped, delta-doped, or grown as doped superlattices. N-type doping usually involves Si incorporation whereas p-type doping usually involves Mg incorporation.

Fabrication usually begins with a surface cleaning using solvents (for degreasing) and acids (for metal and oxide removal). Patterning of all mask levels is readily done with standard photoresist-based microfabrication techniques. The p-contact metallization (typically Ni, Pt, Ag, or Ni/Au) is typically defined first using e-beam evaporation or sputtering. P-contact encapsulation (via selective sputtering of TiW, for example) is preferred to prevent p-contact segregation at high temperature anneals and at high forward bias over time. Placing TiW between the n-contact metallization and n-bond metallization has also been found to help encapsulate the n-contact and prevent alloying between contact and bond metallization. If a rounded (i.e., parabolic, elliptical, spherical) mesa is fabricated, then it may be so done using reactive ion etching (RIE) and inductively coupled plasma (ICP) etching or etching with a chlorine-based chemistry by reflowing resist via elevated heating over time, by grading the photomask in absence of reflow, or by combining both. It should be kept in mind that the chemistry of the resist is quite important for controlling the mesa sidewall geometry. For example, AZ1512 positive resist for sidewall formation has been used successfully. N-contact metallization (typically Ti/Al) is then deposited using e-beam evaporation or sputtering, followed by passivation (typically sputtered $SiO_2$) and bond metal deposition (typically Ni/Au).

Devices may be packaged using GE COB (Chip On Board) flip-chip technology to avoid a silicon submount. In this case, the chip is mounted directly to a PCB board with solder bumps.

Figure 2:
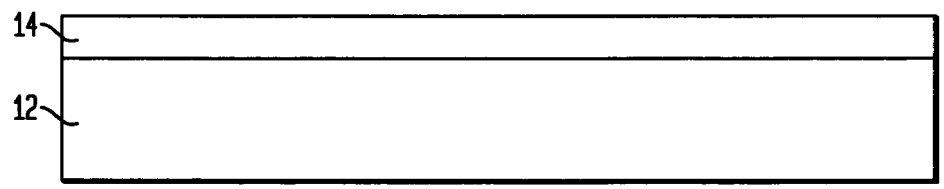
FIG. 2 depicts the formation of a LED of the present invention, in cross-section, at a relatively early stage of production.
Figure 2A:
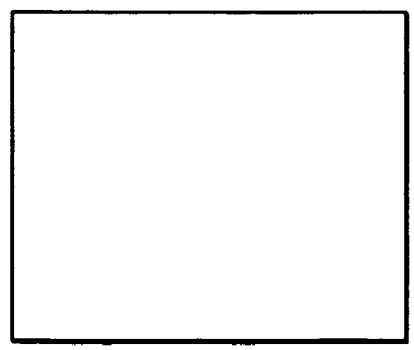
FIG. 2a is a top plan view of the LED depicted in FIG. 2.

Turning now to FIGS. 2-7, and then back to FIG. 1, a process for fabricating LED's of the present invention and arrays of same, shall be described. FIG. 2 depicts a p-metal layer 14 deposited over the base layer 12. P-metal layer may be selected from nickel, rhodium, silver, aluminum, palladium or alloys of same, alloys of Ni—Au, NiO—Au, NiO—Ag, indium-tin-oxide alloys and silver oxide, to enumerate just a few suitable materials. The p-metal can be a non-transparent, reflective or semi-reflective material, such as NiAu, in which case the light generated by the diodes is reflected by the p-pad metal and exits the back of the device. However, arrangements wherein the p-metal metallization is transparent, allowing light to exit the top of the device, are acceptable. A transparent p-metallization can be constructed of thin layers of nickel, platinum, silver, alloys of NiO—Au, NiO—Ag, alloys of In—Sn—O, AgO, rhodium, palladium or platinum.

Figure 3:
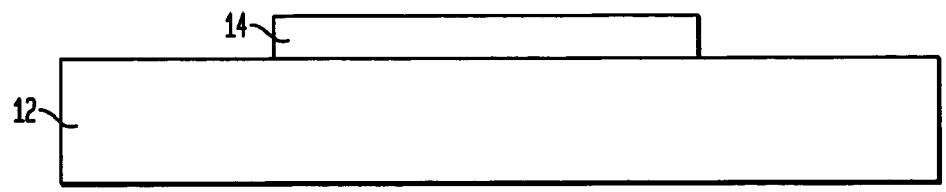
FIG. 3 depicts the formation of a LED of the present invention, in cross-section, subsequent to the FIG. 2 depiction.

FIG. 3 depicts the device after the p-metal 14 layer has been formed into circular diodes. It should be noted that other diode shapes might be employed, depending upon the intended usage of the completed structure; however, a circular geometry is desired for maximal current spreading. The p-metal may be formed by applying a photoresist layer (either positive or negative photoresist) that has been patterned upon the p-metal layer, with openings provided in the photoresist to correspond to locations where p-metal is to be removed. After developing the resist, the device is subjected to a wet etch in order to remove the p-metal at derived locations. Subsequent to etching, the photoresist is removed from the device. While one diode is shown in FIG. 3, it will be appreciated that in many instances a plurality of diodes will be formed the base layer 12, in accordance with the desired diode diameter, pattern, and spacing of same as described later in this disclosure.

Figure 3A:
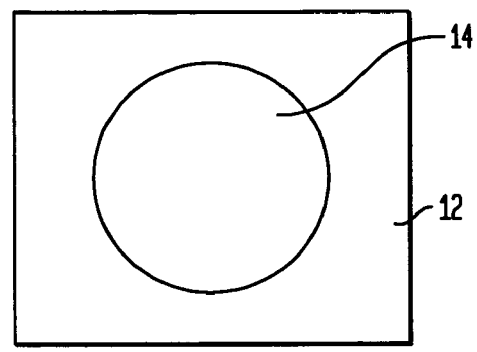
FIG. 3a is a top plan view of the LED depicted in FIG. 3.

The p-metal can be patterned by dry etching techniques, such as RIE and ICP etching. As shown in FIG. 3a, the p-metal has been patterned into a circular shape, while other shapes can be employed, circular diodes are well suited to the production of a source of collimated light.

Figure 4:
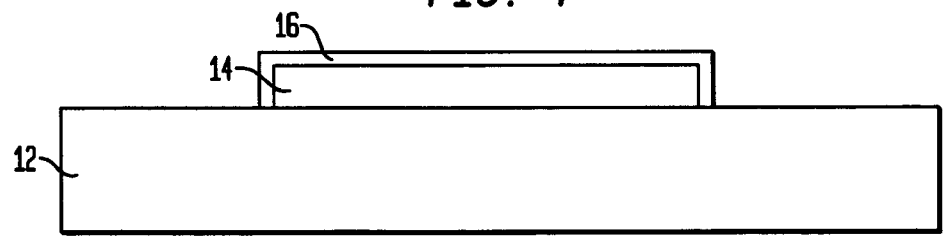
FIG. 4 depicts the formation of a LED of the present invention, in cross-section, subsequent to the FIG. 3 depiction.
Figure 4A:
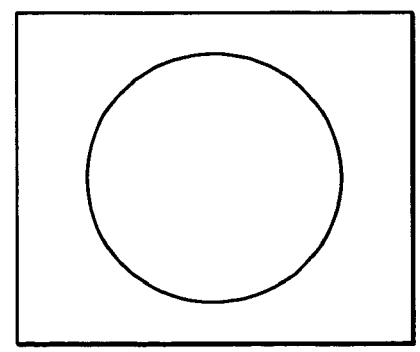
FIG. 4a is a top plan view of the LED depicted in FIG. 4.

FIG. 4 depicts the device after an encapsulant 16 has been applied over and encapsulates the p-metal layer. The encapsulating layer may be applied by standard photolithographic techniques employing a positive or negative photoresist patterned into a mask, development of the mask, application of the encapsulating material, and removal of the mask. A Ti—W alloy may be employed as the material for the encapsulating layer. Because TiW cannot be easily selectively wet-etched, reactive-ion-etching and/or resist liftoff are preferred for selectively patterning TiW encapsulation over the p-contact metallization.

Figure 5:
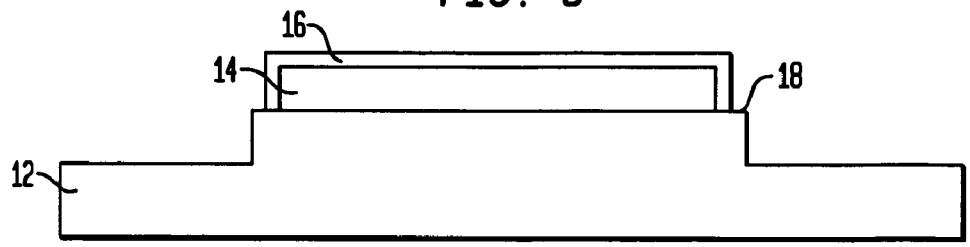
FIG. 5 depicts the formation of a LED of the present invention, in cross-section, subsequent to the FIG. 4 depiction.
Figure 5A:
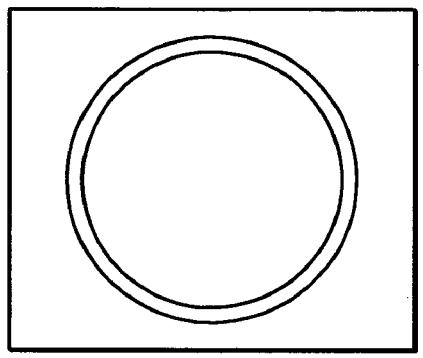
FIG. 5a is a top plan view of the LED shown in FIG. 5 depiction.

FIG. 5 shows device 10 after formation of the mesa 18. As shown, mesa 18 is formed where a preselected portion of base layer 12 is removed from around the p-metal layer 14. Mesas can be formed by patterning a resist (either positive or negative) upon the device, developing the resist in pre-selected areas, selective removal of undeveloped or developed resist and subsequently etching (via wet or dry techniques), portions of substrate selected for removal. ICP etching or RIE etching have been found to be well suited for this process step. Though the dry etch process also removes layers of the resist mask as well as the GaN alloy, the thickness of the resist mask prevents complete removal during dry etching, which usually consists of a chlorine-based chemistry. The remaining resist mask is subsequently chemically stripped from the surface.

As shown in FIG. 8, when forming the mesa in the substrate 30, a portion of the n-doped containing material, active region 36, and p-doped containing material 38 have been removed. However, other arrangements are possible, where only a portion of p-doped material 38 and/or active region 36 are removed during mesa formation. Also, it should be noted that the arrangements other than shown in FIG. 8 are possible, wherein for example, the location of the n-doped layer and p-doped layer are reversed, and/or additional doped or undoped layers are present.

Figure 6:
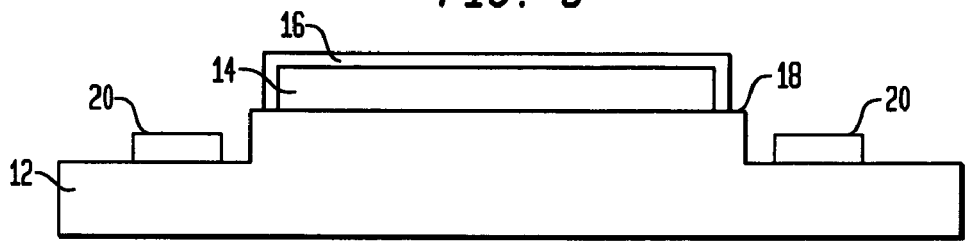
FIG. 6 depicts the formation of a LED of the present invention, in cross-section, subsequent to the FIG. 5 depiction.

FIG. 6 depicts the device after n-metal layer 20, such as titanium, aluminum, titanium-aluminum alloy, titanium tungsten aluminum alloy, TiW, tantalum alloy, or tantalum has been deposited upon the device. A resist is applied to the device, developed at selected locations, removed at undeveloped or developed locations (depending on the use of negative or positive resist), and the n-metal is deposited in the desired areas. The resist is then removed from the device.

Figure 6A:
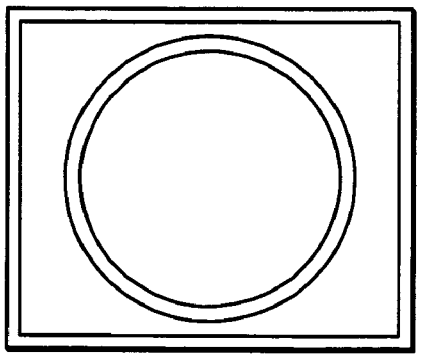
FIG. 6a is a top plan view of the LED shown in FIG. 6.

The n-metal layer is deposited so as to enclose the p-metal layer and mesa within a boundary of n-metal layer, as depicted in FIG. 6a. Sizing of the p-metal layer, and spacing from the p-metal layer and mesa edge, will be discussed later in this disclosure.

As shown in FIG. 6, the n-metal layer has been deposited on the same side of the base layer on which the p-metal has been deposited. This arrangement is employed where a non-conductive material, such as sapphire, is employed as substrate 30. Where the base layer is an electrically conductive material, such as the silicon carbide, or $Al_xIn_yG_{a1-x-y}N$ alloys discussed previously, the n-contact layers may be formed on the side of the substrate opposite the side on which the p-metal layer is positioned.

Figure 7:
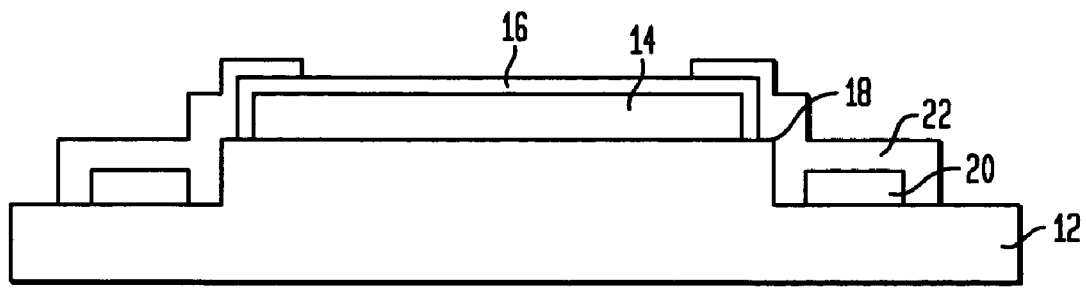
FIG. 7 depicts the formation of a LED of the present invention in cross-section, subsequent to the FIG. 6 depiction.
Figure 7A:
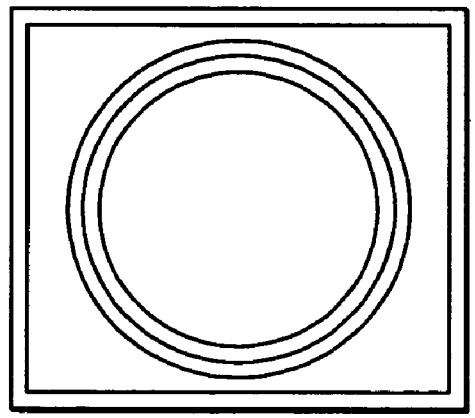
FIG. 7a is a top plan view of the LED shown in FIG. 7.

FIG. 7 depicts the device after formation of a passivation layer 22, which may be a layer of $SiO_2$, SiN, or any suitable oxide or nitride. Passivation layer 20 is positioned over the n-metal contact and extends over the mesa edge to partially encapsulate the p-metal layer 14, with an opening in the passivation layer provided in the top in order to provide electrical contact between p-bond pad and the p-metal layer. The passivation layer may be deposited in accordance with photolithographic techniques previously disclosed, with subsequent removal of the mask.

FIG. 1 shows the LED after the p-bond pad 24 has been formed to contact the p-metal layer 14. If the p-metallization is chosen to be reflective, it is preferred that the p-bond metal not cover the entire p-metallization, so that area is open for light extraction from the top of the device. For example, the p-bond pad and or the p-metallization may be deposited in a grid type pattern to facilitate the transmission of light through the bond pad. The p-bond pad may be applied in accordance with conventional photolithographic techniques as described herein, including wet etching or dry etching after application and development of a mask patterned from a photoresist. The p-bond pad electrically connects the diode to a package or to an electric source. The p-bond metal may consist of Ni & Au, with interlayers of TiW to prevent alloying and metal absorption during high temperature soldering.

As shown in FIG. 9, the applicants have learned that, where the diode is circular and has a diameter of 25 μm, the passivation layer 22 should overlap with the p-metal layer 14 for about 2 μm on the upper side of the p-metal layer. For diodes of larger diameters (e.g. 50 μm and 100 μm), the passivation layer/p-metal layer overlap should be about 5 μm.

Figure 13:
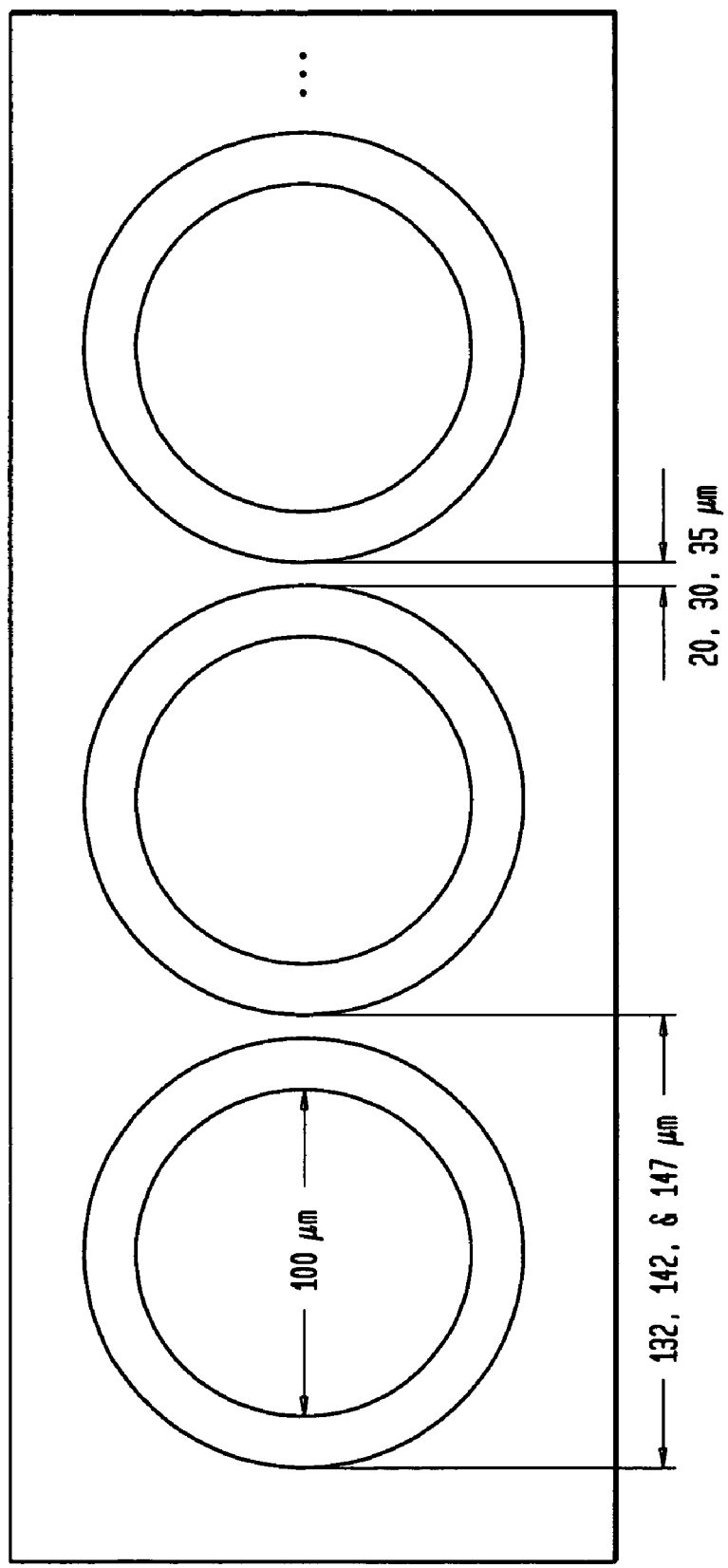
FIG. 13 is a top plan view of 100 μm circular diodes.
Figure 14:
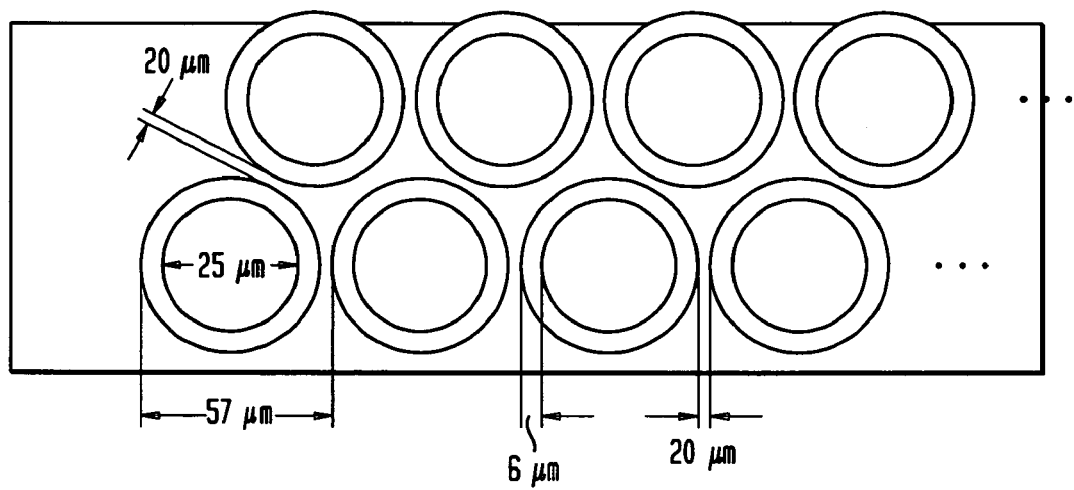
FIG. 14 is a top plan view of 25 μm circular diodes in an offset linear array.

The applicants have further found that the linear distance occupied by the n-metal layer, as measured laterally, between adjacent diodes (See FIG. 10), is dependent upon on diode diameter. For example, where an array of about 25 μm diameter diodes are arranged in a linear array, about 10 μm of n-metal should be present (a linear array is what its name implies, a number of diodes arranged in a single line). About 20 μm of n-doped metal should be present between arrays of about 25 μm circular diodes in a triple, compact, or an offset linear array. See FIGS. 11 and 14. (A triple array is arrangement of three lines of diodes. The diodes of one line may be may be offset from the diodes of the other line. A compact array is an arrangement of four or more lines of diodes. The diodes of a given line may be offset from the diodes of adjacent line or adjacent lines. An offset linear array is an arrangement of two lines of diodes. The diodes of a given line may be offset from the diodes of adjacent line or adjacent lines.) For 50 μl diameter diodes in a linear array, about 10 μm of n-metal layer should be present between adjacent diodes. See FIG. 12. 20 μm should be present between 50 μm diodes arranged in a triple array or an offset linear array, and about 25 μm of n-metal should be present between adjacent 50 μm diodes arranged in a compact array. See FIG. 12. For 100 μm circular diodes, about 20 μm of n-metal layer should be present between adjacent diodes arrayed in a linear array, about 30 μm of n-metal should be present between adjacent diodes arranged in a triple array or an offset linear array, and about 35 μm of n-metal should be present between adjacent diodes arranged in a compact array (see FIG. 13). The guidelines set forth above are summarized in Table 1 below.

TABLE 1

| | Array Type | | |
|---|---|---|---|
| | Linear | Triple | Compact |
| 25 μm | 10 | 20 | 20 |
| 50 μm | 10 | 20 | 25 |
| 100 μm | 20 | 30 | 35 |

The applicants have found that, for compact arrays, a 10×10 arrangement is well suited for 25 μm diodes. For 50 μm and 100 μm diodes, the arrangements may be, respectively, 7×7 and 4×4.

The applicants have further found that the distance between the p-metal layer 14 and edge of the mesa 18 should be about 6 μm (see, e.g. FIGS. 9 and 11), and that the distance between the n-metal layer 20 to the mesa 18 should be about 6 μm. See, e.g. FIG. 10. Thus, about 12 μm should be present between the p-metal and the n-metal layer. This arrangement is well suited for linear arrays, compact arrays, and triple arrays.

FIGS. 11 through 14 illustrate circular diodes arranged in linear arrays and in offset arrays. Linear arrays are effective at emitting energy over a concentrated area however, such area is relatively narrow. Arrangements such as compact arrays or offset arrays broaden the area over which energy is emitted, however the emissions tend to be more efficient (as a function of current applied to the diodes) where diodes are smaller and the number of rows of diodes are relatively few. Thus, it may be appreciated that the offset and/or triple array arrangement provides a relatively fair balancing of two desirable attributes: providing a fairly broad area of coverage and a fair degree of efficiency of energy output based on applied current. Further, as the desired UV focal feature for particle detection is a narrow line width greater than or equal to a single particle diameter and smaller than twice the diameter of a single particle, linear arrays allow for a dense focal line beam to be imaged with simple optics.

Figure 15:
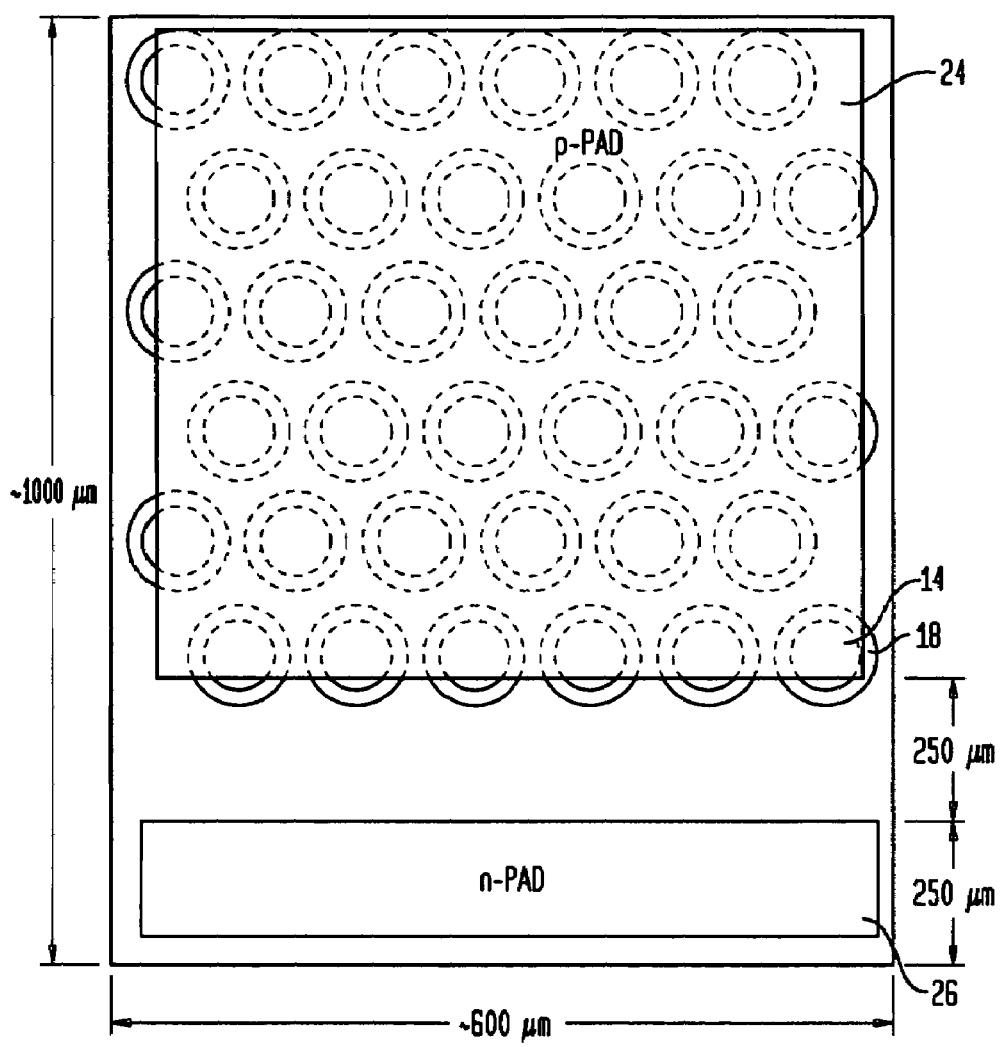
FIG. 15 is a top plan view of a compact array.
Figure 16:
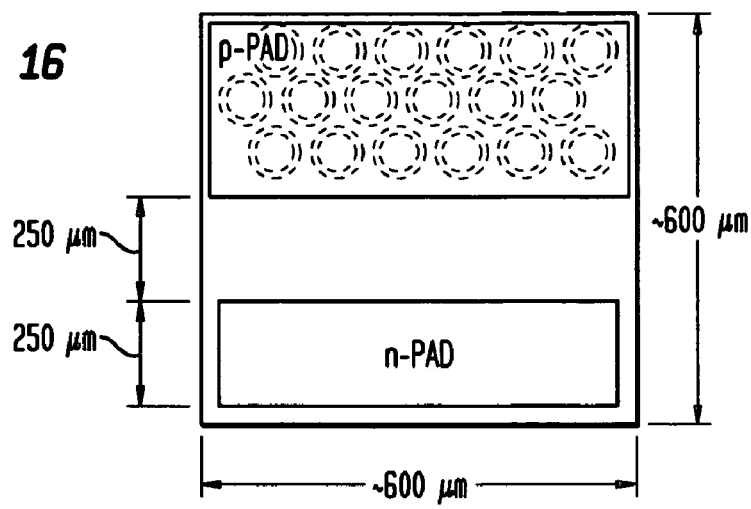
FIG. 16 is a top plan view of a triple array.

FIG. 15 demonstrates a compact array format arrayed upon a substrate having approximate dimensions of about 1000 μm×600 μm. Suitable array formats are for 25 μm diodes, 10×10, for 50 μm diodes, 7×7, and 100 μm diodes, 4×4. Approximate spacing between the positive bond pad 24 and negative bond pad 26 in approximately 250 μm, as shown in FIG. 16. The negative bond pad is positioned on or within the substrate, and makes electrical contact with the n-metal, which is formed upon the substrate in a manner that permits it to contact the n-pad and complete the circuit.

FIG. 16 shows an triple array arranged upon a substrate having approximate dimensions of about 600 μm×600 μm. Suitable array formats are, for 25 μm diodes, 3×10, for 50 μm diodes, 3×7, and for 100 μm diodes, 3×4. Spacing between the diodes is as indicated previously. Approximate spacing between the positive bond pad 24 and the negative bond pad is approximately 250 μm. Triple arrays, where the lines of diodes are offset, provide a firewall effect to decrease, if not eliminate, the possibility that a particle traveling through the field of emission will not encounter emitted UV-energy. Such an arrangement is well suited to a detection system where the encounter between a particle and emitted energy will result in a measurable effect.

As shown in the figures, the diodes of adjacent rows are offset by the length of one-half mesa. However, the diodes may be offset in other arrangements, such as one-third to one-half mesa in length.

Figure 17:
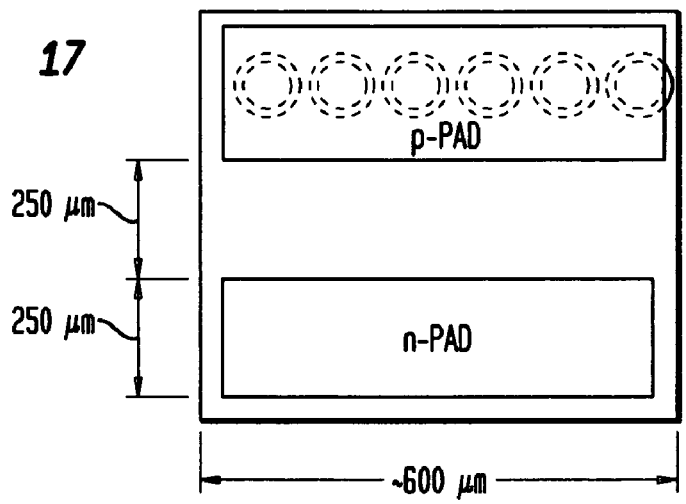
FIG. 17 is a top plan view of a single linear array.

FIG. 17 shows a single linear array shown in a substrate having approximate dimensions of 600 μm×600 μm. Suitable arrangements are, for 25 μm diameter diodes, 10 diodes, for 50 μm diodes, 7 diodes and for 100 μm diodes: 4 diodes.

Figure 18:
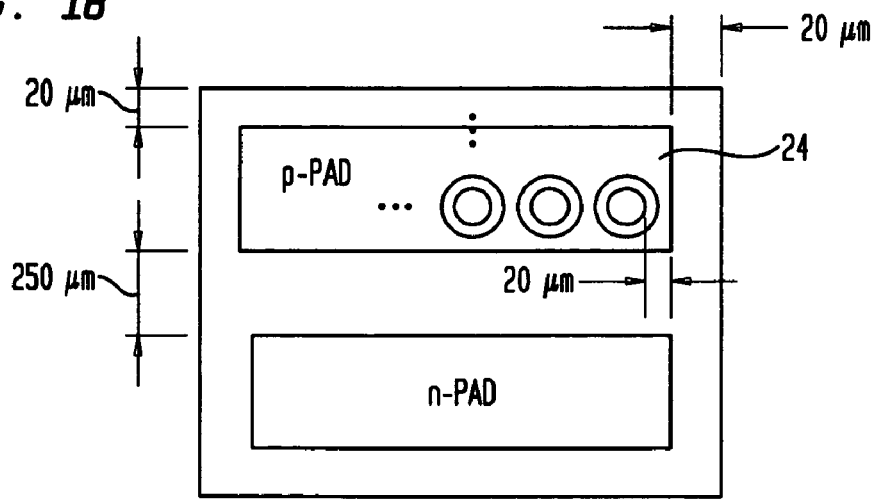
FIG. 18 is a top plan view depicting a particular arrangement.

The applicants have learned that the p-bond pad metal 24 should be distanced about 20 μm from the n-metallization metal. Also, the pad metal should cover the p-metal by about 20 μm from the edge of the p-metal. See FIG. 18.

Figure 19:
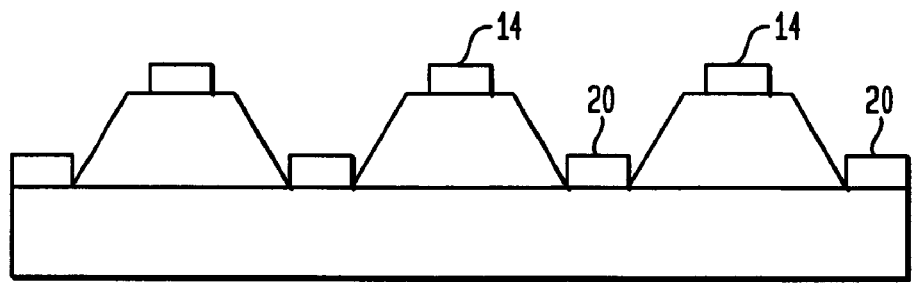
FIG. 19 is a cross sectioned view of an embodiment of the present invention.

FIG. 19 depicts a side view of a plurality of diodes, with the passivation layer not shown. Here, the mesas resemble trapezoids with the p-metal layer 14 situated at the peak and the n-metal situated in the valleys. P- and n-bond metal may be on top of the p- and n-metallization.

Figure 20:
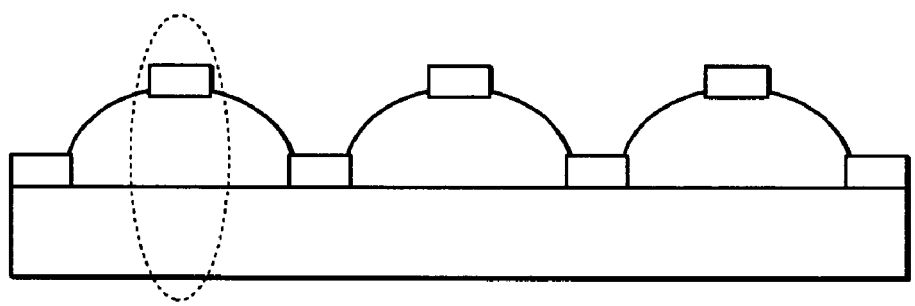
FIG. 20 is a cross sectional view of an embodiment of the present invention.
Figure 21:
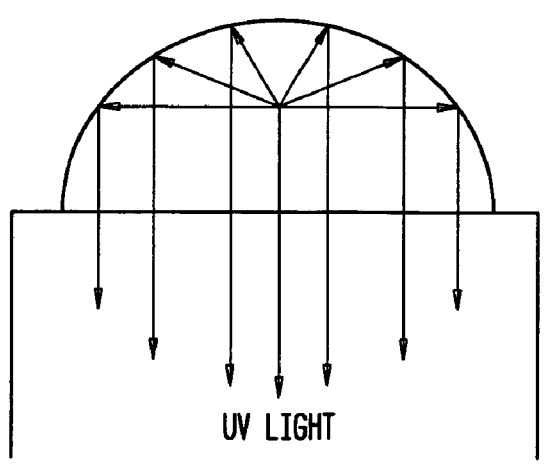
FIG. 21 is a cross sectional view depicting collimation in the LED's shown in FIG. 20.

FIG. 20 depicts a plurality of diodes wherein the sidewalls of the mesas are rounded. A rounded arrangement may be advantageous in terms of collimating the transmission of light, as shown in FIG. 21. That is, where the sidewalls of the mesas are rounded, substantially all light is emitted from the center of the diode. Rounded mesa sidewalls can be produced by engaging in a reflo process prior to etching.

Mesa height should be approximately 500 Å to 20 μm, with about 7000 Å being well suited for producing collimated light.

Figure 22:
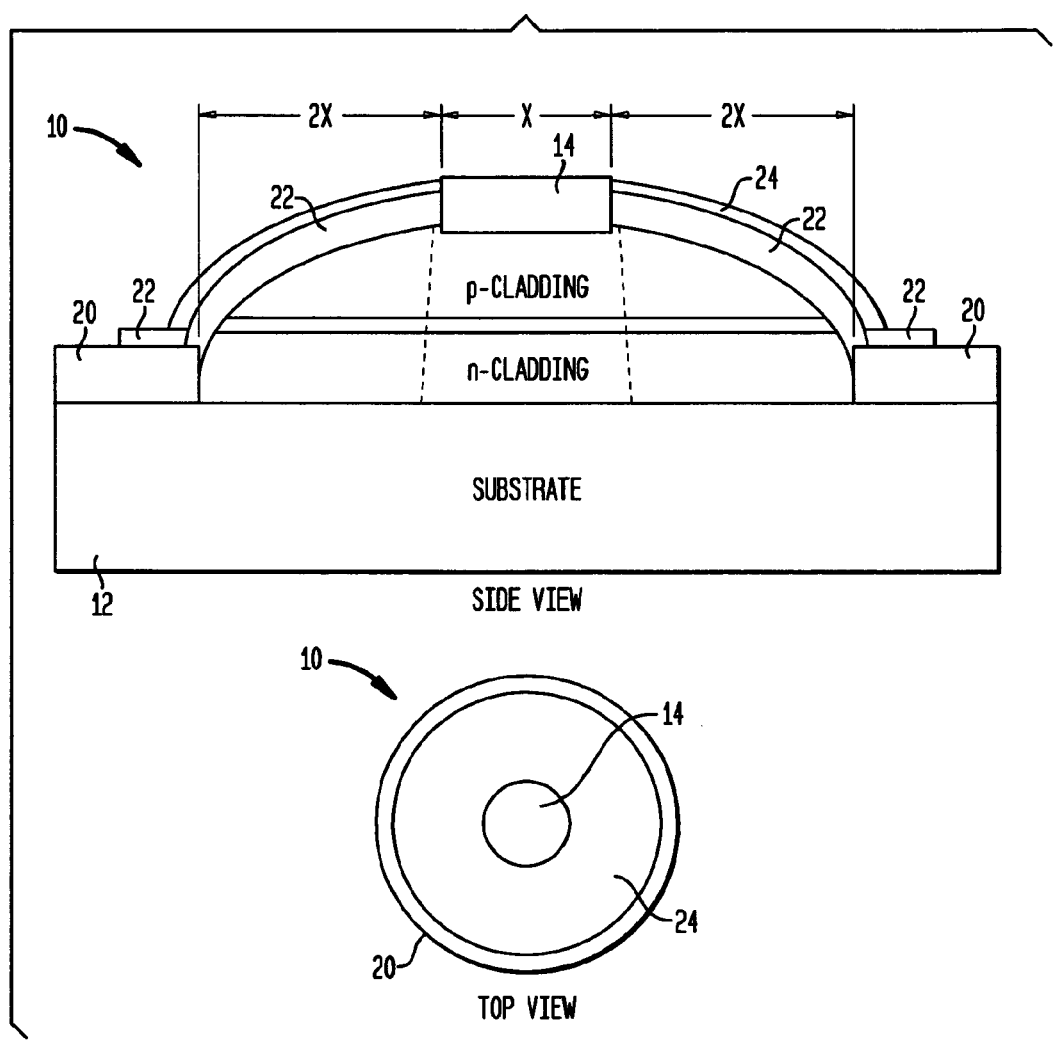
FIG. 22 is a cross sectional view of an embodiment of the present invention.

As further shown in FIG. 22, for parabolic mesas, it has been found that a specific arrangement in which the distance between the edges of the p-contact and n-contact is greater than or equal to the edge-to-edge distance (x), but preferably 2x, of the p-contact, yields collimated light.

Due to the high resistivity of the p-cladding layers, i.e.— sheet resistance typically greater than 10,000 ohms per square, the active region is defined largely by the size of the p-contact metallization.

Figure 23:
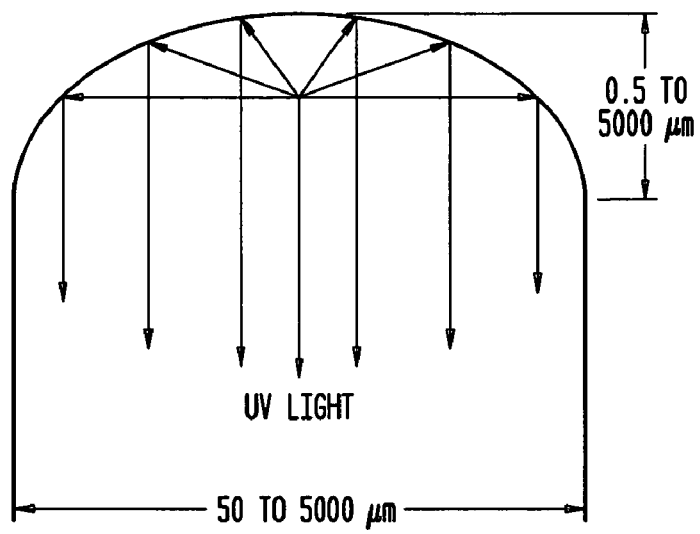
FIG. 23 is a cross sectional view showing the parabolic mirror effect of light leaving the mesa of the structure shown in FIG. 24.
Figure 24:
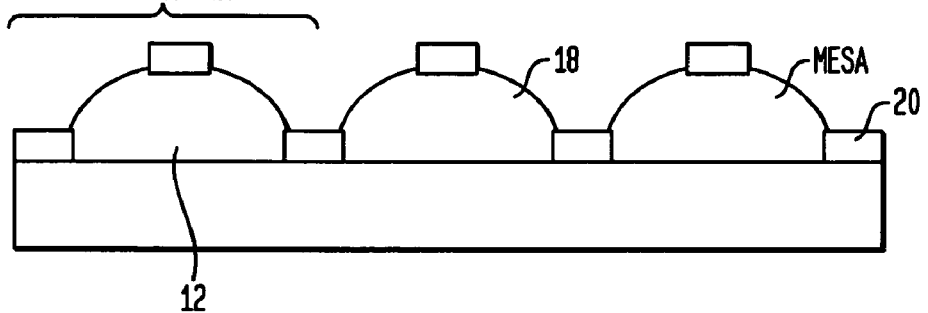
FIG. 24 is a cross sectional view of a particular arrangement of LEDs of the type shown in FIG. 22.

As shown in FIG. 23, good results are obtained when the height of the rounded region of the mesa is 0.5 to 5 µm. Also the edge-to-edge distance of the mesa should be about 5 to 5000 µm.

We claim:

1. A linear array of mesa LED's that emit UV energy, wherein the mesa LED's of the linear array are comprised of a substrate having:
   a base layer;
   an active region;
   a p-doped region;
   a n-doped region;
   wherein the substrate is formed into a plurality of mesas provided with rounded sidewalls when viewed in cross section;
   a p-metallization region is positioned on the mesa;
   a n-metallization region spaced from the p-metallization layer;
   wherein the p-metallization layer and n-metallization layer are in contact with electrical contacts;
   wherein the mesa LED's are arranged in a linear array.

2. The linear array of claim 1 wherein the p-metallization layer is positioned within an encapsulated layer selected from Ti—W alloy, W, Co, Mo, Cr, and other refractory metals.

3. The linear array of claim 1 wherein the LED is further comprised of a passivation layer encasing at least a portion of a region including the p-metallization layer, mesa, and n-metallization layer.

4. The linear array of claim 2 wherein the LED is further comprised of a passivation layer encasing at least a portion of a region including the encapsulating layer, mesa, and n-metallization layer.

5. The linear array of claim 1 wherein the mesa is circular in shape and has a diameter selected between 10 µm and 150 µm, with preferable diameters of 20-30 µm, 40-60 µm, or 80-120 µm.

6. The linear array of claim 1 wherein the n-metallization layer and p-metallization layer are spaced by about 12 µm.

7. The linear array of claim 1 wherein the LED's have a circular diameter of about 25 µm and about 1 to about 50 µm, preferably about 10 µm, of n-metallization layer is present between neighboring LED's.

8. The linear array of claim 1 wherein the LED's have a circular diameter of about 50 µm and about 1 to about 100 µm, preferably about 10 µm, of n-metallization layer is present between neighboring LED's.

9. The linear array of claim 1 wherein the LED's have a circular diameter of about 100 µm and about 1 to about 200 µm, preferably about 20 µm, of n-metallization layer is present between neighboring LED's.

10. The linear array of claim 1 wherein the mesa structure has a shape selected from the group consisting of spherical, elliptical, parabolic, or any combination of these shapes.

* * * * *